(12) United States Patent
Cowles

(10) Patent No.: US 6,545,510 B1
(45) Date of Patent: Apr. 8, 2003

(54) INPUT BUFFER AND METHOD FOR VOLTAGE LEVEL DETECTION

(75) Inventor: Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/016,513

(22) Filed: Dec. 10, 2001

(51) Int. Cl.[7] .................................................. H03K 5/22
(52) U.S. Cl. .......................................... 327/74; 327/76
(58) Field of Search ....................... 327/74–76; 326/59, 326/60; 341/158, 159

(56) References Cited

U.S. PATENT DOCUMENTS

| | | | |
|---|---|---|---|
| 3,806,915 A | * 4/1974 | Higgins et al. | 327/75 |
| 4,177,394 A | * 12/1979 | Takasugi | 327/71 |
| 5,537,024 A | 7/1996 | Lang | 320/48 |
| 5,572,147 A | 11/1996 | Huang et al. | 326/33 |
| 5,898,324 A | 4/1999 | Yanagisawa | 327/81 |
| 6,037,762 A | 3/2000 | Koelling et al. | 323/313 |
| 6,104,651 A | 8/2000 | Cowles et al. | 365/201 |
| 6,147,521 A | 11/2000 | Degoirat et al. | 327/81 |
| 6,278,648 B1 | 8/2001 | Cowles et al. | 365/230.03 |
| 6,289,476 B1 | 9/2001 | Cowles | 714/718 |

* cited by examiner

Primary Examiner—Kenneth B. Wells
(74) Attorney, Agent, or Firm—Snell & Wilmer

(57) ABSTRACT

An improved input buffer circuit and method configured for voltage detection is provided that can facilitate use of a mid-level voltage for testing purposes. An exemplary input buffer configured for voltage detection comprises a reference generator and a multi-state detector. The reference generator is configured to generate at least two reference voltages to be provided as input signals to the multi-state detector. The multi-state detector is suitably configured to receive an input reference signal, and through comparison of the input reference signal to the two reference voltages, provide output signals to three output terminals representing a high, low and mid-level state of operation. An exemplary input buffer circuit can comprise two differential pairs of transistors configured in a back-to-back arrangement and sharing a common node, thus resulting in lower current requirements. In addition, the input buffer can provide for multiple operations from the same die pad without requiring the addition of command pins.

24 Claims, 4 Drawing Sheets

INPUT BUFFER AND METHOD FOR VOLTAGE LEVEL DETECTION

TECHNICAL FIELD

The present invention relates, generally, to input buffers. More particularly, the present invention relates to an input buffer and method configured for voltage level detection that can facilitate detection and use of multiple levels of voltage for operation, such as for testing purposes, as well as provide for multiple operations from the same input pad.

BACKGROUND OF THE INVENTION

Input buffers have been long used in various analog and digital applications. While many input buffers are optimized for AC switching techniques and applications, other input buffers are configured for optimizing voltage detection. Through use of input buffers configured as voltage detectors, a determination can be made whether to initiate or cease a particular system function. Such voltage detectors are often configured to detect the level of the supply voltage ($V_{CC}$) of integrated circuits, including the detection of specified ranges for which an integrated circuit is designed, prohibiting operation of the integrated circuit if the level of voltage is outside the specified range, or determining whether a threshold level has been reached before permitting operation of a particular application within the integrated circuit.

In general, input buffers configured as voltage detectors are configured to operate for only one threshold level, i.e., trip for only one point, to confirm whether the voltage level is above or below the threshold level. For example, in microprocessor-based applications, an input buffer configured as a source voltage detector can be utilized to detect the voltage level of the power supply voltage within the memory modules of the microprocessor-based system. Through this detection process that determines whether a threshold level has been reached, the voltage detector can initiate signals to control devices to operate the power supply voltage for the memory blocks of the microprocessor-based system.

Many integrated circuit applications are designed with voltage detectors configured for detecting operation at a high voltage, a "super voltage" or "SV" level. This SV level, which is configured internally within the chip, is generally for use only by circuit manufacturers and is set above normal operating conditions to suitably test the die, i.e., to place the die in different testing conditions, and is not typically utilized by consumers of the integrated circuits. While such SV levels were originally designed for between 9 volts to 12 volts, improvements and changes to the various technologies and processes has resulted in the lowering of the SV levels to 7 volts or less to prevent breaking down from the active area to the substrate on the die, and thus moved the SV levels closer to the operating range of integrated circuits. Such developments in the SV levels have resulted in limited margins of operation for such testing applications.

In addition to a reduction of the SV levels, circuit designers have required modern integrated circuits (ICs) to be configured with a minimal number of pins to simplify the input/output connection system of the integrated circuits. Moreover, input buffers configured as voltage detectors, which are more commonly comprised of CMOS-based logic devices, are generally designed to provide for two states of operation, i.e., the input buffer is configured to accept high or low voltage signals from external sources and then provide a logic state to the integrated circuit corresponding to the high or low signals. For example, the voltage detectors are typically configured to work from one point, and to detect a voltage level when it is in a "high" condition, i.e., greater than a threshold voltage, and in a "low" condition, i.e., lower than a threshold voltage. Further, modern voltage detectors are configured to operate in either "high" or "low", or in the transition in between, but not in the midrange, i.e., in between "high" or "low."

With reference to FIG. 1, a prior art input buffer 100 configured for voltage detection is illustrated. Input buffer 100 comprises a differential amplifier including two input terminals, e.g. the gates of transistors $M_3$ and $M_4$, coupled to an input signal INPUT and a reference signal REF, and having an output signal OUT_DIFF provided from the output of a series of succeeding or cascading inverter stages 102, 104 and 106. Input buffer 100 is configured to amplify the difference between the input signal INPUT and the reference signal REF into a high or low signal.

For example, with reference to FIG. 2, during operation, when input signal INPUT is at zero or ground, e.g., the output of transistor $M_2$ is zero, the inverted output signal OUT_DIFF will remain as a high signal; when input signal INPUT goes above the reference signal REF, the output signal OUT_DIFF will switch to a low signal; and when input signal INPUT again goes below the reference signal REF, the output signal OUT_DIFF will switch again to a high signal. Thus, only two states of operation are realized, high and low, i.e., input buffer 100 recognizes a high or low state, but not any other states in between the two states.

As a result of being limited to two states of operation, the functions of an IC using such an input buffer 100 are also somewhat restricted. For example, in an IC that has two command pins A and B, with two states that can be realized for each, has only four functions or commands can be decoded, i.e., for A,B=0,0; A,B=0,1; A,B=1,0; A,B=1,1. Although increasing the number of pins can increase the number of functions available, with the trend towards smaller packages, it is difficult and adds complexity and cost to the overall design and manufacturing of the IC to implement additional control pins to packages.

Therefore, a need exists for an improved input buffer configured for voltage detection that can facilitate use of a mid-level voltage for testing purposes, as well as provide for multiple operations from the same input pad.

SUMMARY OF THE INVENTION

The present invention addresses many of the shortcomings of the prior art. In accordance with various aspects of the present invention, an improved input buffer and method configured for voltage detection system are provided that can facilitate detection of a multiple levels of voltage, such as a mid-level voltage that may be used for testing purposes. In accordance with an exemplary embodiment, an exemplary input buffer circuit configured for voltage detection comprises a reference generator and a multi-state voltage detector. The reference generator is configured to generate at least two reference voltages to be provided as input signals to the multi-state detector. In accordance with an exemplary embodiment, the multi-state detector comprises a three-state detector. The three-state detector is suitably configured to receive an input reference signal, and through comparison of the input reference signal to at least two reference voltages, provide output signals to at least three output terminals representing a high, low and mid-level state of operation. In accordance with an exemplary embodiment, the three-state detector comprises two differential pairs of transistors configured in a back-to-back arrangement and sharing a common node, thus resulting in lower current requirements.

In accordance with another aspect of the present invention, an exemplary input buffer circuit can facilitate multiple operations from the same input pad. For example, through use of a three-state detector, at least three states of operation can be realized. Thus, in accordance with an exemplary embodiment in which three states of operation are realized, up to eight decoded states can be obtained. As a result, additional functions can be provided by the three-state detector without requiring the addition of command pins to the IC design. Moreover, through the detection of additional levels of voltage besides the detection of a mid-level voltage range, even more functions can be provided without adding command pins.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE PRESENT INVENTION

Figure 1:
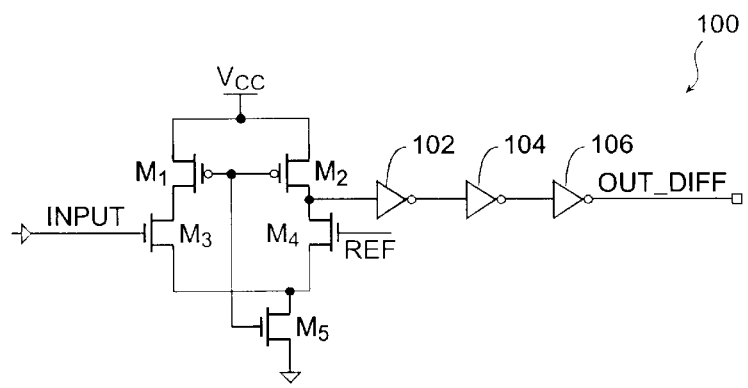
FIG. 1 illustrates a schematic diagram illustrating a prior art input buffer configured for voltage detection.
Figure 2:
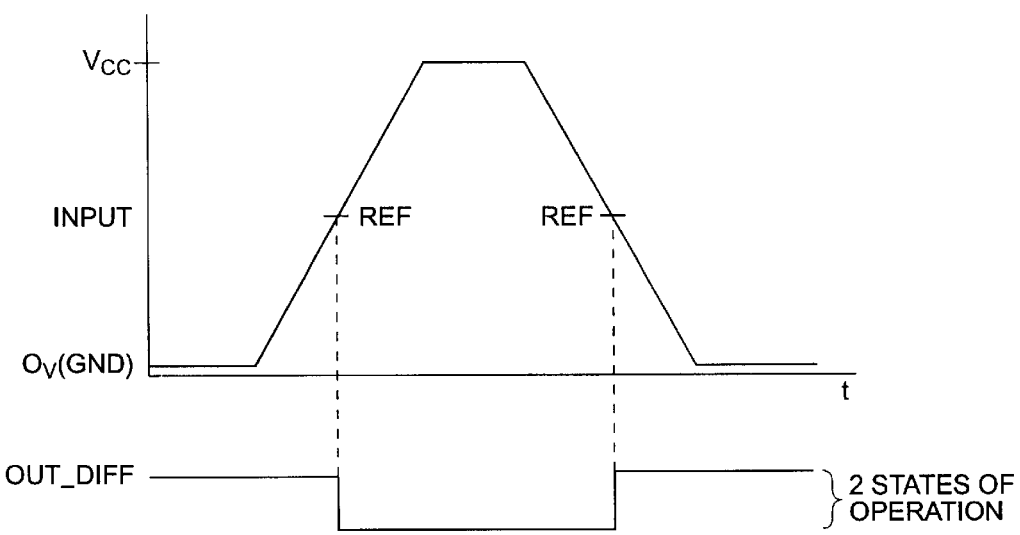
FIG. 2 illustrates a timing diagram for operation for a prior art input buffer configured for voltage detection.

The present invention may be described herein in terms of various functional components and various processing steps. It should be appreciated that such functional components and steps may be realized by any number of hardware or structural components configured to perform the specified functions. For example, the present invention may employ various integrated components, e.g., buffers, supply references, current mirrors, signal processors and the like, comprised of various electrical devices, e.g., resistors, transistors, capacitors, diodes and other components whose values may be suitably configured for various intended purposes. In addition, the present invention may be practiced in any integrated circuit application where voltage detectors or input buffers can be utilized. For example, the present invention may be utilized within any application specific integrated circuit (ASIC), any very large scale integration (VLSI) circuit, or any other integrated circuit application. Such general applications that may be appreciated by those skilled in the art in light of the present disclosure are not described in detail herein. However for purposes of illustration only, exemplary embodiments of the present invention will be described herein in connection with an a memory chip application. Further, it should be noted that while various components may be suitably coupled or connected to other components within exemplary circuits, such connections and couplings can be realized by direct connection between components, or by connection or coupling through other components and devices located therein-between.

As discussed above, current input buffers configured for voltage detection have a limited margin of operation for testing conditions, such as for use of a super voltage (SV) condition. In addition, present input buffers configured for voltage detection are configured only for two states of operation, and have output functions limited by the number of command pins. However, in accordance with various aspects of the present invention, an improved input buffer circuit and method configured for voltage detection are provided that can facilitate use of a mid-level voltage for testing purposes, as well as provide for multiple operations from the same die pad.

In accordance with an exemplary embodiment, an exemplary input buffer circuit configured for voltage detection comprises a reference generator and a multi-state voltage detector. In accordance with this exemplary embodiment, the reference generator is configured to generate at least two reference voltages to be provided as input signals to the multi-state detector. In addition, while the reference generator can be internally generated within the input buffer circuit, the reference generator could be provided by various external circuits coupled to the input buffer circuit. The multi-state detector is suitably configured to receive an input reference, and through comparison to the at least two reference voltages, provide output signals to at least three output terminals representing at least a low, a high, and a mid-level state of operation.

Figure 3:
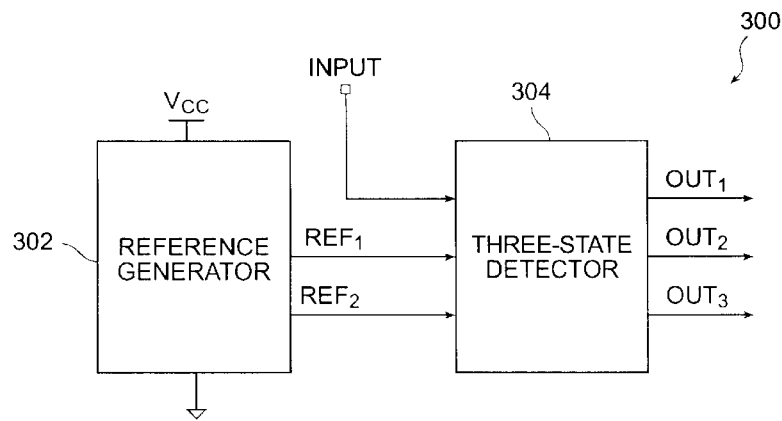
FIG. 3 illustrates an exemplary embodiment of an input buffer circuit configured for voltage detection in accordance with the present invention.

For example, in accordance with an exemplary embodiment of the present invention, with reference to FIG. 3, an exemplary input buffer circuit 300 configured for voltage detection is illustrated. In accordance with this embodiment, input buffer circuit 300 suitably comprises a reference generator 302 and a three-state detector 304. Reference generator 302 is configured to receive a supply voltage $V_{CC}$ and to generate at least two reference voltages, $REF_1$ and $REF_2$, to be provided as input signals to three-state detector 304. Reference generator 302 can comprise any circuit configuration for generating reference voltages, and can include any number of transistor devices configured in various buffer, current source and/or switching arrangements, and any number of resistor and/or capacitor components. Moreover, such transistor devices can comprise MOS transistor devices, or BJT devices. Further, reference generator 302 can be configured internally to input buffer 300, or can be provided from external circuits.

Three-state detector 304 is suitably configured to recognize or detect an intermediate, or mid-level, range of voltage in addition to high and low conditions. In accordance with an exemplary embodiment, three-state detector 304 is configured to receive an input voltage reference INPUT, and through comparison to the two reference voltages, $REF_1$ and $REF_2$, provide three output signals representing low ($OUT_1$), mid-level ($OUT_2$), and high ($OUT_3$) states of operation. As a result, three-state detector 304 is capable of recognizing a mid-level range of voltage operation. Through the use of such a mid-level range of operation, testing conditions can be conducted within a safe mid-level voltage range, instead of an SV condition precariously close to the high operating range for a given process, while still operating as a tandem input device for a conventional two-state input buffer.

For example, with a high signal representing 2.0 volts and a low signal representing 0.8 volts, and with a mid-level detection set for between a reference signal $REF_1$ of approximately 0.8 volts, and a reference signal $REF_2$ of approximately 2.0 volts, input buffer circuit 300 can still provide for two-state operation with the understanding that input signal INPUT is generally well below 0.8 volts or above 2.0 volts, or quickly transitioning in between, e.g., within approximately 2 nanoseconds. Thus, when input signal INPUT is within the mid-level detection period of 1.2–1.6 volts for any longer duration, i.e., not simply within a normal transition through the mid-level region, a mid-level output signal ($OUT_2$) can be provided by three-state detector 304. It should be noted that the high and low signal levels can be configured in various ranges depending on the application at hand.

Three-state detector 304 suitably comprises a pair of differential input buffers configured for receiving two reference voltages $REF_1$ and $REF_2$ and for comparing to input reference INPUT. While the pair of input buffers can be configured in various manners, in accordance with an exemplary embodiment, three-state detector 304 suitably comprises two differential pairs of transistors configured in a back-to-back arrangement and sharing a common node. Such an embodiment also results in lower current requirements, as well be described in more detail below.

Figure 4:
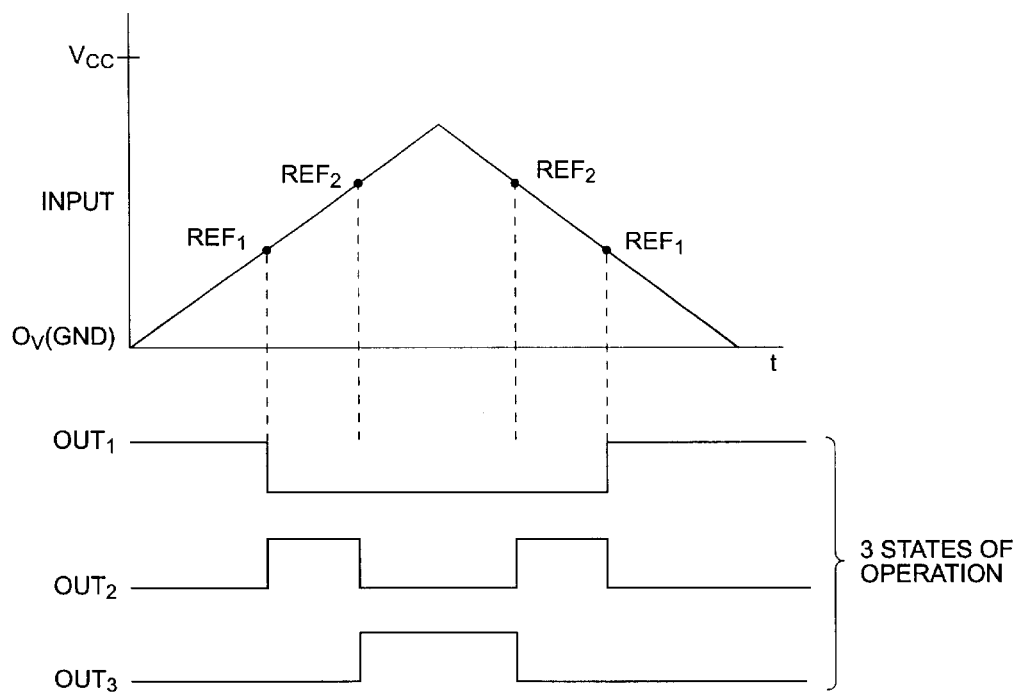
FIG. 4 illustrates a timing diagram of an input buffer configured for voltage detection in accordance with an exemplary embodiment of the present invention.

With reference to FIG. 4, during operation of input buffer circuit 300, when input signal INPUT is at zero or ground, output signal $OUT_1$ will remain as a high signal, while output signals $OUT_2$ and $OUT_3$ will remain low, which indicates input signal INPUT is less than reference signal $REF_1$, and thus in a low state. As input signal INPUT ramps upwards above reference signal $REF_1$, but remains below reference signal $REF_2$, output signal $OUT_1$ will switch to a low signal, output signal $OUT_2$ will switch to a high signal, and $OUT_3$ will remain low, which indicates that input signal INPUT is within a mid-level range. Thereafter, as input signal INPUT ramps upwards above reference signal $REF_2$, output signal $OUT_1$ will remain at a low signal, output signal $OUT_2$ will switch to back to a low signal, and $OUT_3$ will switch to a high signal, which indicates the input signal is in high state.

As input signal INPUT transitions back to a low level, e.g., to ground, three-state detector 304 can provide corresponding output signals representing low ($OUT_1$), mid-level ($OUT_2$), and high ($OUT_3$) states of operation. Accordingly, at least three states of operation are realized, low, mid-level, and high, i.e., input buffer circuit 300 recognizes not only a high or low state, but also a state in between these two conditions. As a result, at least three types of operating ranges can be obtained from an integrated circuit application.

The addition of a mid-level operating range can facilitate a more desirable testing option for circuit designers. For example, through the use of such a mid-level range of operation, testing conditions can conducted within a safe mid-level voltage range, instead of an SV condition precariously close to the high operating range. Possibly even more notable than the ability to conduct testing conditions during the mid-level range of voltages, the providing of an additional range of operation can facilitate various advantages in the pin requirements and functions within an integrated circuit package. Still further, the mid-level detector can also be configured to provide for lower current requirements in a dual input buffer configuration.

In accordance with another aspect of the present invention, an exemplary input buffer circuit 300 configured for voltage level detection can facilitate multiple operations from the same input pad. For example, through use of a three-state detector 304, at least three states of operation can be realized. Thus, for example, for two command pins A and B, with at least three states that can be realized for each, at least eight functions or commands can be provided, i.e., for A,B=0,0; A,B=0,1; A,B=0,x; A,B=1,0; A,B=1,1; A,B=1,x; A,B=x,0; and A,B=x,1, where x represents a mid-level state, at least eight different logic output conditions can be realized, without increasing the number of command pins. In other words, additional functions can be facilitated by three-state detector 300 without requiring the addition of command pins to the voltage detection system.

Accordingly, through use of three-state detector 304, the number of command inputs from other devices and circuits is significantly reduced by reducing the number of pins necessary to decode the command inputs. For example, for a synchronous dynamic random access memory (SDRAM) application, which is needed to keep pace with modern computer systems, having a plurality of command inputs, such as chip select (CS), column address strobe (CAS), row address strobe (RAS), and WE, the number of pins necessary to decode all the possible command inputs is significantly reduced from an integrated circuit package.

While the above exemplary embodiments of input buffer circuit 300 are configured with a three-level detector 304 for providing three output signals $OUT_1$, $OUT_2$, and $OUT_3$ representative of a low, mid-level and high condition, it should again be noted that input buffer circuit 300 can be configured with a multi-state detector for facilitating additional ranges of voltage detection. For example, reference generator 302 could be configured to provide one or more additional reference voltages, for example, reference voltages $REF_3$ and $REF_4$, that are greater than reference voltage $REF_2$ but less than supply voltage $V_{CC}$, to be provided as input signals to a multi-state detector 304. Through comparison of input reference INPUT to two additional reference voltages, $REF_3$ and $REF_4$, multi-state detector 304 can provide at least five output signals representing five states of operation.

For example, a multi-state voltage detector 304 can provide a low ($OUT_1$), i.e., INPUT is less than $REF_1$, a lower mid-level ($OUT_2$), i.e., INPUT is greater than $REF_1$ and less than $REF_2$, a mid-level ($OUT_3$), i.e., INPUT is greater than $REF_2$ and less than $REF_3$, an upper mid-level ($OUT_4$), i.e., INPUT is greater than $REF_3$ and less than $REF_4$, and a high ($OUT_5$), i.e., INPUT is greater than $REF_4$ and less than supply voltage $V_{CC}$, states of operation. In addition, for two command pins A and B, with at least five states that can be realized for each, even additional functions or commands can be realized from input buffer circuit 300.

Accordingly, an exemplary an input buffer circuit can be configured with a reference generator, whether internal to the input buffer circuit, or from an external circuit, for generating a plurality of reference voltages provided to a multi-state detector to output a plurality of states of operation. As a result, not only can various levels of operation be used for other purposes, such as testing, but also the functionality of the integrated circuit devices can be greatly increased without increasing the number of command pins per circuit.

Figure 5:
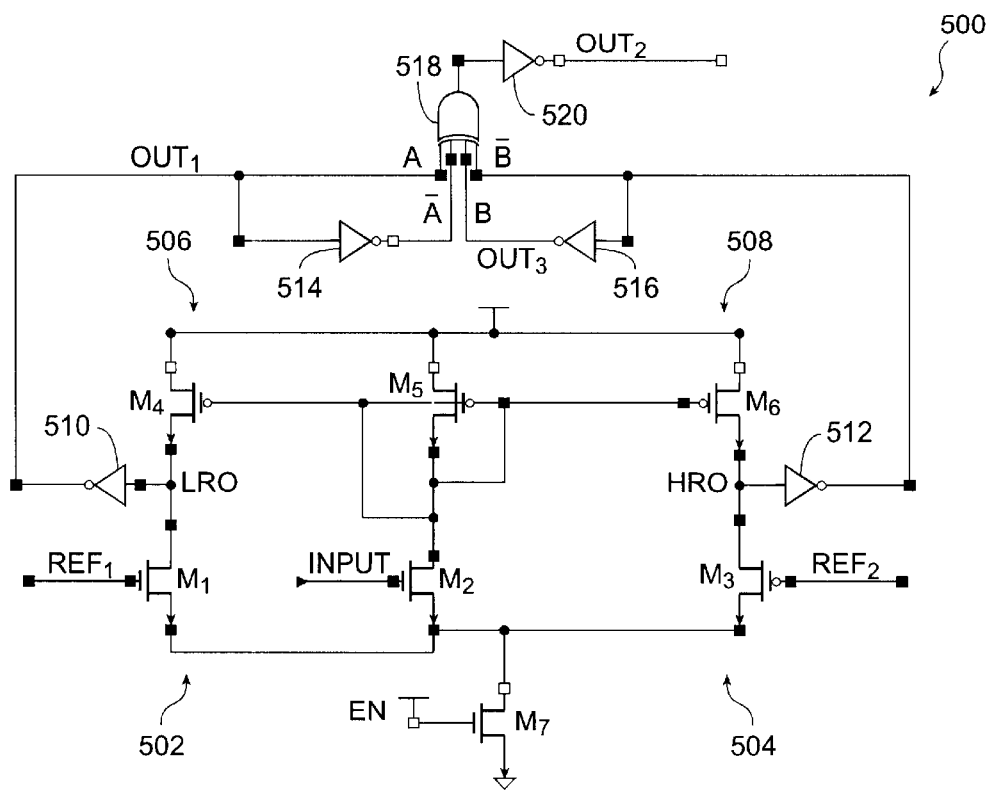
FIG. 5 illustrates an exemplary input buffer configured for multi-state detection in accordance with an exemplary embodiment of the present invention.

As discussed above, three-state detector 304 can be configured in various manners to provide a mid-level voltage range of operation. For example, in accordance with an exemplary embodiment of the present invention, with reference to FIG. 5, an exemplary three-state detector 500 is illustrated. Three-state detector 500 is suitably configured to provide an output signal representing a mid-level range of operation. In this embodiment, three-state detector 500 suitably comprises a pair of differential input buffers configured for receiving two reference voltages $REF_1$ and $REF_2$ and for comparing to input reference INPUT. While the pair of differential input buffers can be configured in various manners, in accordance with this exemplary embodiment, the pair of differential input buffers comprise two differential pairs of transistors configured in a back-to-back arrangement and sharing a common node, thus resulting in lower current consumption.

For example, a first input pair 502 comprises transistors $M_1$ and $M_2$, each having sources coupled together, and a second input pair 504 comprises transistors $M_3$ and $M_2$, each having sources coupled together, i.e., both input pairs 502 and 504 share a common connection to the source of transistor $M_2$, all of which can be coupled to ground. In addition, transistor $M_1$ has a gate coupled to reference voltage $REF_1$, transistor $M_2$ has a gate coupled to input reference voltage INPUT, and transistor $M_3$ has a gate coupled to reference voltage $REF_2$. In accordance with the exemplary embodiment, transistors $M_1$, $M_2$ and $M_3$ comprise n-channel devices in an n-channel differential pair design; however, in accordance with other exemplary embodiments, three-state detector 500 could also be configured in a p-channel differential pair design, with p-channel devices for transistors $M_1$, $M_2$ and $M_3$, i.e., with input pairs 502 and 504 suitably replaced with p-channel devices and having sources coupled to a supply voltage ($V_{CC}$).

Each input pair 502 and 504 is suitably coupled to current mirror circuits 506 and 508, respectively. Current mirror circuits 506 and 508 are configured to provide output signals corresponding to a comparison of said input voltage and said two reference voltages. Current mirror circuit 506 comprises p-channel transistors $M_4$ and $M_5$, having gates connected together, and current mirror circuit 508 comprises p-channel transistors $M_6$ and $M_5$, also having gates connected together. Common transistor $M_5$ is configured in a diode-like manner, i.e., the gate and source are connected together. Thus, to couple input pairs 502 and 504 to current mirror circuits 506 and 508, the drains of transistors $M_1$, $M_2$ and $M_3$ are connected to the drains of transistors $M_4$, $M_5$ and $M_6$, respectively. In addition, the sources of transistors $M_4$, $M_5$ and $M_6$ are coupled to a supply voltage ($V_{CC}$).

Output signals from the pair of differential input buffers 502 and 504 can be provided to a low reference output (LRO) node and to a high reference output (HRO) node, respectively. In the exemplary embodiment, low reference output node LRO is configured at the drain of transistor $M_1$ and the source of transistor $M_4$, while high reference output node HRO is configured at the drain of transistor $M_3$ and the source of transistor $M_6$.

Three-state detector 500 also comprises logic devices configured to provide the low level, mid-level, and high level output signals. In accordance with this exemplary embodiment, three-state detector comprises a plurality of inverters 510, 512, 514, 516 and 520, and an exclusive OR gate 518. Inverters 510, 512, 514, 516 and 520 can comprise any conventional inverter configuration. For example, each of inverters 510, 512, 514, 516 and 520 can comprise a CMOS transistor inverter stage configured with one PMOS and one NMOS transistor, wherein the NMOS transistor provides a switch connection to ground when an input to the inverter is a logic high, while the PMOS device provides a connection to a $V_{DD}$ power supply rail when the input to the inverter is a logic low. Meanwhile, exclusive OR gate 518 can also comprise any conventional circuit for providing an exclusive OR function.

Inverter 510 is configured to receive a signal from low reference output node LRO and provide an output signal $OUT_1$, which is indicative of the low level of input signal INPUT, i.e., less than reference voltage $REF_1$. The output signal of inverter 510 is coupled to the input of inverter 514 and, along with the output of inverter 514, is coupled to the input of exclusive OR gate 518. Meanwhile, inverter 512 is configured to receive a signal from high reference output node HRO and provide an output signal which is coupled to the input of inverter 516 and, along with the output of inverter 516 which provides the high level output signal $OUT_3$, also to the input of exclusive OR gate 516. Inverter 520 is connected to the output of exclusive OR gate 516, and is configured to provide an output signal $OUT_2$ that is representative of a mid-level voltage range.

Three-state detector 500 can also be suitably configured with an enable circuit to control the turning "on" and "off" of three-state detector during operation of an integrated circuit. For example, three-state detector 500 can include a transistor $M_7$ coupled between the sources of transistors $M_1$, $M_2$ and $M_3$ and ground. Transistor $M_7$ includes an enable signal EN coupled to its gate, which can be suitably enabled by any command signal. Moreover, three-state detector 500 could be permanently enabled by tying the gate of transistor $M_7$ to supply voltage $V_{CC}$, to a DC supply $V_{DC}$ or, for example, to reference voltages $REF_1$ or $REF_2$.

While three-state detector 500 is configured with a pair of differential input buffers sharing a common node, it should be noted that two independent input buffers, i.e., without a common node, could also be realized in accordance with other exemplary embodiments of the present invention. However, it should be noted that such independent differential input buffers absorb a significant amount of current during the switching operation. For example, each independent input buffer can consume 600 microamps or more of current, resulting in a total of 1.2 milliamps of current being consumed. With a common node configuration, e.g., sharing of transistors $M_2$ and $M_5$ within input buffers 502 and 504 and current mirrors 506 and 508, however, approximately 600 microamps are consumed. In addition, during switching of transistors $M_1$, $M_2$ and $M_3$ as input signal INPUT increases and decreases, a small surge of current is realized for a common node configuration, for example as little as 220 microamps. However, in an embodiment with independent input buffers, as much as five times or more current can be realized.

Moreover, in that operation of three-state detector 500 may not require fast operation for detecting the mid-level voltage range, e.g., when the mid-level range is used for testing purposes rather than full operation, the current consumed by three-state detector 500 can be further minimized by reducing the current transistors $M_1$ through $M_6$ can supply, e.g., by decreasing the respective transistor channel width or increasing the transistor channel length. Further, in an exemplary embodiment including enable circuit with transistor $M_7$, current can be choked off by coupling the gate of transistor $M_7$ to one of supply voltage $V_{CC}$, to DC supply $V_{DC}$ or, for example, to reference voltages $REF_1$ or $REF_2$, as well as using a transistor size for transistor $M_7$ having less strength. On the other hand, to configure three-state detector 500 to operate more like an normal buffer, the sizes, strengths, and W/L ratios of the various transistors can be suitably increased or otherwise adjusted, as well as separately providing an enable signal to the gate of transistor $M_7$ for controlling operation of three-state detector 500.

Figure 7:
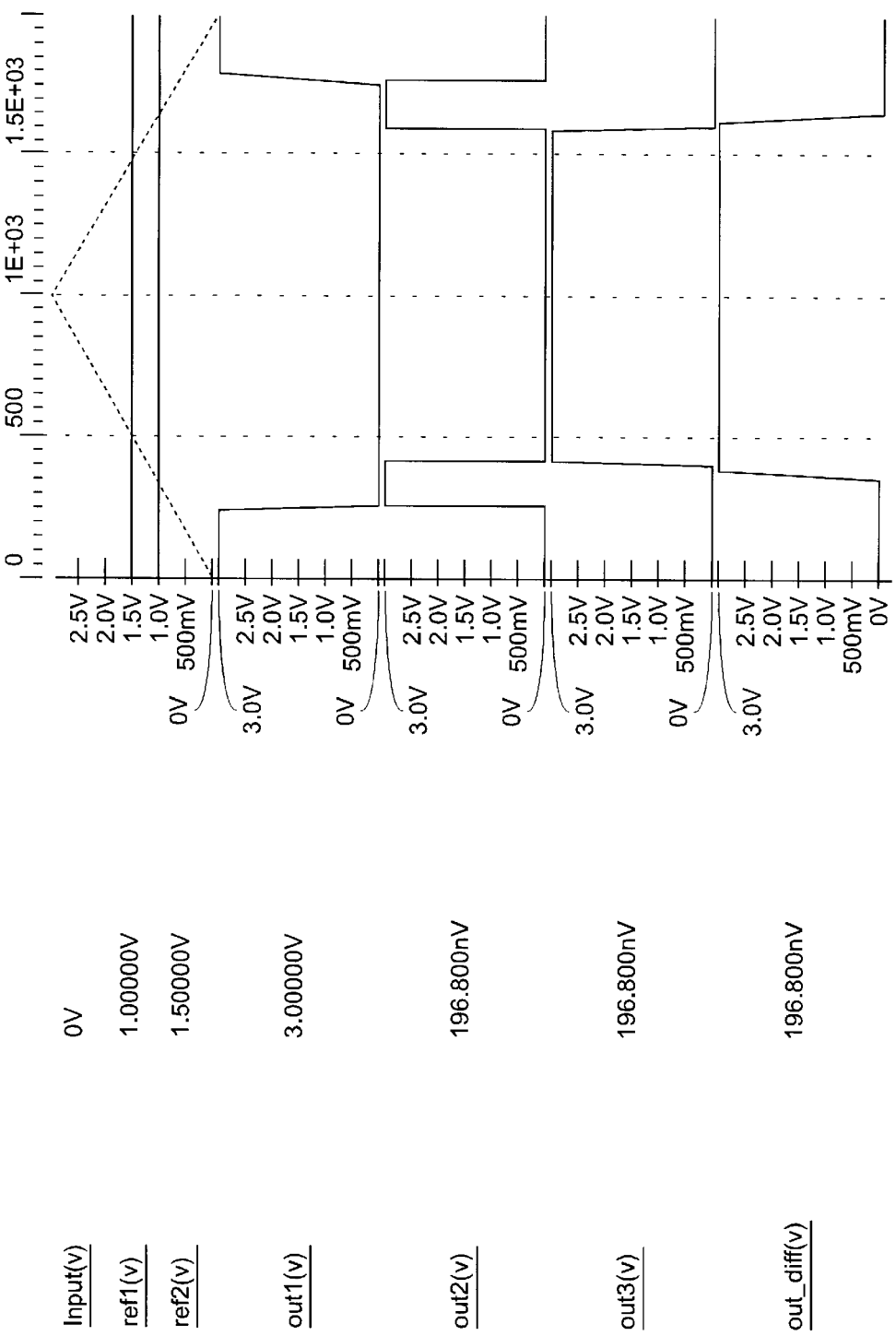
FIG. 7 illustrates a timing diagram of simulation results of an exemplary input buffer configured for multi-state detection in accordance with an exemplary embodiment of the present invention.

Having described an exemplary embodiment of a three-state detector 500, an example of operation can now be provided with reference to a simulated timing diagram illustrated in FIG. 7. In this example, reference voltage $REF_1$ comprises a 1.0 volt signal, while reference voltage $REF_2$ comprises a 1.5 volt signal. For an initial condition, when input reference INPUT is at ground, and thus less than both reference voltages $REF_1$ and $REF_2$, more current will flow through transistor $M_1$ and $M_3$ than $M_2$, resulting in an output at nodes LRO and HRO. As a result, an output signal will be realized at output reference $OUT_1$, e.g., at A, and at the input to inverter 516. Accordingly, in that output reference $OUT_1$ is a high signal, and $OUT_3$, the inverted output signal of inverter 516, will be a low signal at B, the output of exclusive OR gate 518 will be a high signal that is provided to inverter 520, resulting in a low signal for output reference $OUT_2$.

Output references $OUT_1$, $OUT_2$, and $OUT_3$ will remain in those states until input reference INPUT increases above the voltage level of reference voltage $REF_1$. When this occurs, more current will flow in transistor $M_2$ than $M_1$ such that an output will no longer result at node LRO, and thus at output reference $OUT_1$, i.e., at A. Meanwhile, node HRO will remain in a "high" state, and output reference $OUT_3$ will continue to provide a low signal at B, and thus provide a low signal at the output of exclusive OR gate 518, resulting in a high signal for output reference $OUT_2$. Accordingly, three-state detector 500 suitably indicates that input reference INPUT is operating within the mid-level range determined by reference voltages $REF_1$ and $REF_2$. As input reference INPUT continues to increase above the voltage level of reference voltage $REF_2$, such that more current flows within transistor $M_2$ than transistor $M_3$, an output will no longer result at node HRO, causing output reference $OUT_3$ at the output of inverter 512 to become a high signal at B. As a result, a high signal is realized at the output of exclusive OR gate 518, thus resulting in a low signal for output reference $OUT_2$. Thus, three-state detector 500 suitably indicates that input reference INPUT is no longer operating within the mid-level range, but is in the high state of operation.

While the above exemplary embodiment illustrates an example for providing mid-level detection, it should be noted that various changes and modifications can be made to three-state detector 500 in accordance with other exemplary embodiments of the present invention. For example, three-state detector 500 can be configured with additional input pairs configured to receive additional reference voltages and comprising back-to-back pairs of transistors configured to share a common node. As a result, additional ranges of voltage can be suitably detected. In addition, three-state detector 500 can be configured with additional or fewer logic device configurations, including additional or fewer cascading inverter stages, or any other logic configuration capable of providing corresponding output signals $OUT_1$, $OUT_2$ and $OUT_3$. Moreover, the DC supply voltages and transistor device sizes, strengths, and W/L ratios can also be configured in various manners depending on any number of different design criteria.

Figure 6:
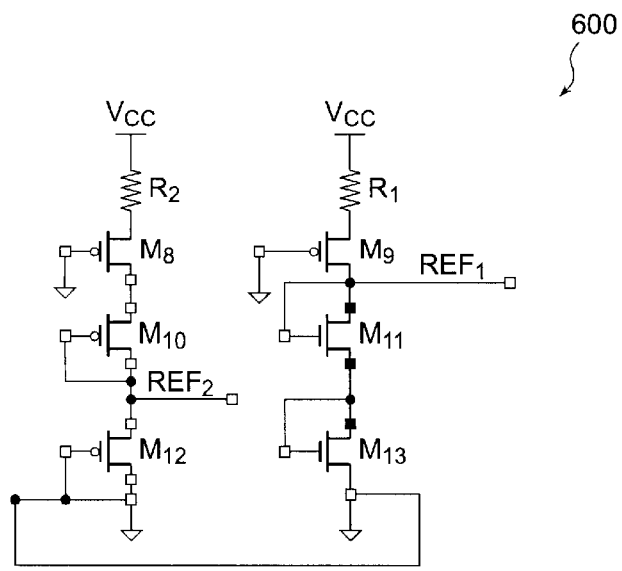
FIG. 6 illustrates an exemplary embodiment of a reference voltage generator in accordance with the present invention.

In addition, as discussed above, any reference voltage signals used within three-state detector 500 can be generated in various manners, whether internal to an input buffer circuit, or provided externally from other integrated circuits and devices. For example, in accordance with an exemplary embodiment, with reference to FIG. 6, a reference generator 600 is configured for generating a first reference voltage $REF_1$ and a second reference voltage $REF_2$ from supply voltage $V_{CC}$. Reference generator 600 suitably includes a resistor divider circuit comprising an input p-channel transistor $M_9$ having a source coupled to supply voltage $V_{CC}$ through a resistor $R_1$, comprising a resistance value configurable to provide a desired voltage, and a pair of n-channel transistors $M_{11}$ and $M_{13}$ coupled in series to ground. Input p-channel transistor $M_9$ is suitably configured with its gate connected to ground, such that p-channel transistor $M_9$ is always turned "on." Through operation of the resistor divider circuit, reference voltage $REF_1$ can be suitably generated at the drain of transistor $M_9$.

Likewise, reference generator 600 includes another resistor divider circuit comprising an input p-channel transistor $M_8$ coupled through its source to supply voltage $V_{CC}$ through a resistor $R_2$, comprising a resistance value configurable to provide a desired voltage, and a pair of p-channel transistors $M_{10}$ and $M_{12}$ coupled in series to ground. Input p-channel transistor $M_8$ is also suitably configured with its gate connected to ground, such that p-channel transistor $M_8$ is always turned "on." Through operation of the additional resistor divider circuit, reference voltage $REF_2$ can be suitably generated at the drain of transistor $M_{10}$.

As a result, reference generator 600 can provide at least two reference voltages $REF_1$ and $REF_2$ to a voltage detection system. It should be noted that the various resistor values and transistor sizes can be modified depending on the desired output of reference voltages. In addition, one or more additional resistor divider circuits can be included within reference generator 600 to provide additional reference voltages, e.g., $REF_3$ and $REF_4$. Moreover, reference generator 600 can be configured in any manner now known or hereinafter devised for generating reference voltages.

The present invention has been described above with reference to various exemplary embodiments. However, those skilled in the art will recognize that changes and modifications may be made to the exemplary embodiments without departing from the scope of the present invention. For example, the various processing steps, as well as the components for carrying out the processing steps, may be implemented in alternate ways depending upon the particular application or in consideration of any number of cost functions associated with the operation of the system. In addition, any type of transistor devices configured for performing the intended functions can be utilized. These and other changes or modifications are intended to be included within the scope of the present invention, as set forth in the following claims.

What is claimed is:

1. An input buffer configured for detecting multiple voltage levels within an integrated circuit, said input buffer comprising:
    at least two differential input pairs configured in a back-to-back arrangement and sharing a common node, said at least two differential input pairs being configured for receiving an input voltage and at least two reference voltages, including a first reference voltage and a second reference voltage; and
    wherein said input buffer compares said input voltage to said first reference voltage and said second reference voltage, and provides a first output signal when said input voltage is less than said first reference voltage, a second output signal when said input voltage has a level of voltage between that of said first reference voltage and said second reference voltage, and a third output signal when said input voltage is greater than said second reference voltage.

2. The input buffer according to claim 1, wherein said input buffer is configured for receiving more than two reference voltages and for generating more than three output signals corresponding to a comparison of said input voltage and said more than two reference voltages.

3. The input buffer according to claim 1, wherein said at least two differential input pairs comprise:
- a first transistor having a gate coupled to said first reference voltage;
- a second transistor having a gate coupled to said input voltage, and a source coupled to a source of said first transistor;
- a third transistor having a gate coupled to said second reference voltage, and a source coupled to said source of said second transistor such that said two differential input buffers share said common node.

4. The input buffer according to claim 3, wherein said input buffer further comprises two current mirror circuits coupled to said two differential input pairs to provide output signals corresponding to a comparison of said input voltage and said two reference voltages.

5. The input buffer according to claim 4, wherein said two current mirror circuits comprise:
- a fourth transistor having a gate coupled to a drain of said second transistor, and a drain coupled to a drain of said first transistor;
- a fifth transistor having a gate coupled to said gate of said fourth transistor and said drain of said second transistor;
- a sixth transistor having a gate coupled to said drain of said second transistor, and a drain coupled to a drain of said third transistor.

6. The input buffer according to claim 5, wherein said input buffer further comprises a pair of inverters, with a first inverter coupled to said drains of said first transistor and said fourth transistor, and with a second inverter coupled to said drains of said third transistor and said sixth transistor, wherein said pair of inverters are configured to provide output signals corresponding to said low output signal and said high output signal.

7. The input buffer according to claim 6, wherein said input buffer further comprises a plurality of logic devices comprising:
- a third inverter having an input coupled to an output of said first inverter, said input corresponding to said low output signal;
- a fourth inverter having an input coupled to an output of said second inverter, said fourth inverter having an output corresponding to said high output signal;
- an exclusive OR gate having inputs coupled to outputs of said third inverter and said fourth inverter; and
- a fifth inverter having an input coupled to an output of said exclusive OR gate, and an output corresponding to said mid-level output signal.

8. An input buffer circuit for detecting a mid-level voltage range of operation of an integrated circuit, said input buffer circuit comprising:
- a reference generator configured for receiving a supply voltage and for generating two reference voltages, said two reference voltages representing a first reference voltage and a second reference voltage, said second reference voltage being greater than said first reference voltage;
- a multi-state detector configured for receiving an input voltage and said two reference voltages and, wherein said multi-state detector compares said input voltage to said first reference voltage and said second reference voltage, and provides a first output signal corresponding to a low input signal when said input voltage is less than said first reference voltage, a second output signal corresponding to a mid-level input signal when said input voltage has a level of voltage between that of said first reference voltage and said second reference voltage, and a third output signal corresponding to a high input signal when said input voltage is greater than said second reference voltage.

9. The input buffer circuit according to claim 8, wherein said reference generator is configured for generating additional reference voltages than said two reference voltages, and said multi-state detector is configured for generating additional output signals corresponding to a comparison of said input voltage and said additional reference voltages.

10. The input buffer circuit according to claim 8, wherein said multi-state detector comprises two differential input buffers configured in a back-to-back arrangement and sharing a common node.

11. The input buffer circuit according to claim 10, wherein said two differential input buffers comprise:
- a first transistor having a gate coupled to said first reference voltage;
- a second transistor having a gate coupled to said input voltage, and a source coupled to a source of said first transistor;
- a third transistor having a gate coupled to said second reference voltage, and a source coupled to said source of said second transistor such that said two differential input buffers share said common node.

12. The input buffer circuit according to claim 11, wherein said first transistor, said second transistor and said third transistor comprise n-channel transistor devices.

13. The input buffer circuit according to claim 11, wherein said multi-state detector further comprises two current mirror circuits coupled to said two differential input buffers to provide output signals corresponding to a comparison of said input voltage and said two reference voltages.

14. The input buffer circuit according to claim 13, wherein said two current mirror circuits comprise:
- a fourth transistor having a gate coupled to a drain of said second transistor, and a drain coupled to a drain of said first transistor;
- a fifth transistor having a gate coupled to said gate of said fourth transistor and said drain of said second transistor;
- a sixth transistor having a gate coupled to said drain of said second transistor, and a drain coupled to a drain of said third transistor.

15. The input buffer circuit according to claim 14, wherein said multi-state detector further comprises a pair of inverters, with a first inverter coupled to said drains of said first transistor and said fourth transistor, and with a second inverter coupled to said drains of said third transistor and said sixth transistor, wherein said pair of inverters being configured to provide output signals corresponding to said low output signal and said high output signal.

16. The input buffer circuit according to claim 15, wherein said multi-state detector further comprises a plurality of logic devices comprising:
- a third inverter having an input coupled to an output of said first inverter, said input corresponding to said low output signal;
- a fourth inverter having an input coupled to an output of said second inverter, said fourth inverter having an output corresponding to said high output signal;

an exclusive OR gate having inputs coupled to outputs of said third inverter and said fourth inverter; and a fifth inverter having an input coupled to an output of said exclusive OR gate, and an output corresponding to said mid-level output signal.

17. A multi-state detector for identifying multiple levels of voltage during operation of an integrated circuit device, said multi-state detector comprising:

a first differential input buffer configured for receiving a first reference voltage and an input voltage;

a second differential input buffer configured for receiving a second reference voltage and said input voltage, said second differential input buffer being configured to share a common node with said first differential buffer, and wherein said multi-state detector compares said input voltage to said first reference voltage and said second reference voltage, and provides an output signal when said input voltage has a level of voltage between that of said first reference voltage and said second reference voltage and provides another output signal when said input voltage has a level of voltage of at least one of less than said first reference voltage and greater than said second reference voltage.

18. The multi-state detector of claim 17, wherein said multi-state detector provides at least three states of operation that provide multiple functions to command pins within an integrated circuit to increase capabilities for decoding states within said integrated circuit.

19. The multi-state detector of claim 17, wherein said first differential input buffer and said second differential input buffer comprise:

a first transistor having a gate coupled to said first reference voltage;

a second transistor having a gate coupled to said input voltage, and a source coupled to a source of said first transistor;

a third transistor having a gate coupled to said second reference voltage, and a source coupled to said source of said second transistor such that said two differential input buffers share said common node to minimize current consumption by said first differential input buffer and said second differential input buffer.

20. A method for detecting multiple levels of voltage during operation of an integrated circuit device, said method comprising the steps of:

receiving an input voltage and a first reference voltage in a first differential input buffer;

receiving said input voltage and a second reference voltage in a second differential input buffer, providing a first output signal when said input voltage is at a voltage level below that of said first reference voltage and said second reference voltage;

providing a second output signal corresponding to said voltage level when said input voltage is at said voltage level between that of said first reference voltage and said second reference voltage, and providing a third output signal when said input voltage is at a voltage level above that said first reference voltage and said second reference voltage.

21. The method according to claim 20, further comprsing the steps of:

providing at least eight decoded states of operation corresponding to said low output signal, said mid-level output signal, and said high output signal without increasing command pin requirements in an integrated circuit.

22. The method according to claim 20, where in said second differential input buffer is configured in a back-to-back arrangement and sharing a common node with said first differential input buffer.

23. A multi-state detector for detecting multiple levels of voltage within an integrated circuit device, said multi-state detector comprising a first differential input buffer configured for receiving a first reference voltage and an input voltage;

a second differential input buffer configured for receiving a second reference voltage and said input voltage, said second differential input buffer being configured to share a first common node with said first differential input buffer;

a first current mirror circuit coupled to said first differential input buffer to provide an output signal corresponding to a comparison of said input voltage and said first reference voltage, and a second current mirror circuit coupled to said second differential input buffer to provide an output signal corresponding to the comparison of said input voltage and said second reference voltage, said first current mirror circuit and second current mirror circuit sharing a second common node.

24. The multi-state detector according to claim 23, wherein said multi-state detector compare said input voltage to said first reference voltage and said second reference voltage, and provides an output signal when said input voltage has a level of voltage between that of said first reference voltage and said second reference voltage and provides another output signal when said input voltage has a level of voltage of at least one of less than said first reference voltage and greater than said second reference voltage.

* * * * *